United States Patent
Ishitani et al.

(10) Patent No.: US 7,235,798 B2
(45) Date of Patent: Jun. 26, 2007

(54) FOCUSED ION BEAM APPARATUS

(75) Inventors: Tohru Ishitani, Hitachinaka (JP);
Hiroyuki Muto, Hitachinaka (JP);
Yuichi Madokoro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 59 days.

(21) Appl. No.: 11/151,425

(22) Filed: Jun. 14, 2005

(65) Prior Publication Data

US 2005/0279952 A1 Dec. 22, 2005

(30) Foreign Application Priority Data

Jun. 15, 2004 (JP) .............. 2004-177261

(51) Int. Cl.
*G21K 5/10* (2006.01)

(52) U.S. Cl. .......... 250/492.21; 250/309; 250/398; 250/397

(58) Field of Classification Search .............. None
See application file for complete search history.

(56) References Cited

U.S. PATENT DOCUMENTS 5,852,297 A * 12/1998 Ishitani et al. ......... 250/492.21

2006/0097197 A1 * 5/2006 Sakaguchi .............. 250/492.21

FOREIGN PATENT DOCUMENTS

| JP | 05-052721 | 3/1993 |
| JP | 2774884 | 4/1998 |
| JP | 2002-251976 | 9/2002 |
| JP | 02005063865 A * | 3/2005 |

OTHER PUBLICATIONS

Yoshim Kawanami, et al."Design of high-current-density focused-ion-beam optical system with the aid of a chromatic aberration formula," J. Vac. Sci. Technol. B 8 (6), Nov./Dec. 1990, pp. 1673-1675.

H. Kasahara, et al. "A 0-30 keV low-energy focused ion beam system," J. Vac. Sci. Technol. B 6 (3), May/Jun. 1988, pp. 974-976.

* cited by examiner

*Primary Examiner*—Jack I. Berman
*Assistant Examiner*—Zia R. Hashmi
(74) *Attorney, Agent, or Firm*—McDermott Will & Emery LLP

(57) ABSTRACT

In order to implement faster high precision milling and high resolution image observation in the structure analysis and failure analysis of the MEMS and semiconductor devices, a two-lens optical system is mounted on a focused ion beam apparatus, and in the optical system the distance from an emitter apex in an ion source to an earth electrode included in a condenser lens and disposed nearest to the ion source is in the range of 5 to 14 mm.

7 Claims, 5 Drawing Sheets

FOCUSED ION BEAM APPARATUS

BACKGROUND OF THE INVENTION

The present invention relates to a focused ion beam (FIB) apparatus.

At present, focused ion beam apparatuses are used in many fields. In particular, a fine focused beam can be applied to a micro area of devices and materials. Furthermore, this apparatus focuses an ion beam from an ion source through a lens and irradiates the beam onto a specimen, and the apparatus is used for milling and observing a specimen in a micro area. For example, it is possible to use the apparatus for observation of a specimen by irradiating an ion beam of a relative low current onto the specimen and detecting secondary particles generated from the specimen. Furthermore, it is possible to mill a specimen by irradiating an ion beam of a relatively high current onto the specimen.

In addition, the focused ion beam is used for structure analysis and failure analysis of microelectrical mechanical systems (MEMS) and semiconductor devices. These elements have been integrated in recent years. In general, therefore, they have a layered structure. For this reason, to inspect them, it is necessary to conduct cross-sectioning up to a specified layer and inspect the cross-section structure. As the MEMS and semiconductor devices become finer, their structures also become gradually complicated. Therefore, the number of cross sections to be inspected increases more and more, and the time which can be used for inspection per cross section becomes shorter and shorter. Since the focused ion beam is applicable to both milling and observation, it is effective to the structure analysis and failure analysis of the MEMS and semiconductor devices. First, the current of the ion beam is increased and milling is conducted from the surface down to a specified layer. Then, the current of the ion beam is decreased and the specified layer is inspected.

For example, a conventional apparatus described in U.S. Pat. No. 5,852,297 has an optical system in which a total optical length from apex of an ion emitter of an ion source to a specimen is in the range of 300 to 450 mm. The distance between the ion emitter and the center of a condenser lens center is 45 mm or less. The distance between the objective lens center and the specimen is 40 mm or less. A FIB formed by this optical system has a maximum current density $J_{max}$ of at least 15 A/cm². As for a fine milling beam in a milling mode, a beam current $I_p$ is $I_p \geq$ several tens pA and a beam diameter d is $d \leq 40$ nm. As for an observation beam in an observation mode, $I_p \geq$ several pA and $d \leq 15$ nm.

In the focused ion beam apparatus, the milling position precision substantially depends on the beam diameter d in the milling mode. This results in a problem that, if d is not small enough, the apparatus cannot be suited for the fine structure and features in the structure analysis and failure analysis of the MEMS and semiconductor devices. On the other hand, the milling speed is substantially proportionate to the beam current $I_p$. If $I_p$ is not large enough, the milling speed becomes slow. For meeting the needs of still higher throughput of the FIB milling in the structure analysis and failure analysis, therefore, it has become a subject to increase the beam current density, i.e., increase the beam current without making the beam diameter of the milling beam large. In the observation mode, on the other hand, the focused ion beam apparatus has a problem that, if the ion beam is not fine enough, it is not possible to observe the structure and features of fine MEMS and semiconductor devices in the structure analysis and failure analysis.

Another problem in the observation mode is that, if the current of the ion beam is not large enough, the obtained signal is too small to detect an image with a sufficient signal-to-noise ratio. As semiconductors become finer, it has become a subject to make the observation beam still finer.

The above-described conventional apparatus example does not meet the needs of still higher throughput in FIB milling especially on the high current side. For example, in 30-kV Ga-FIB in the conventional apparatus, a beam having $d \approx 1$ µm is associated with $I_p \approx 16$ nA. It is now supposed that box milling with a length 20 µm, a width 20 µm and a depth 20 µm is conducted on the surface of a Si specimen by using this beam. The milling yield Y of a Si specimen using 30 kV Ga-FIB depends on the scanning velocity of the FIB, and it is the range of 0.2 to 0.8 µm³/nA·s. Under the condition Y=0.25 µm³/nA·s, the time taken for box milling amounts to approximately 17 minutes. Therefore, it is not possible to meet the needs of higher throughput in the structure analysis and failure analysis of the MEMS and semiconductor devices for conducting a lot of milling of this kind in a short time.

SUMMARY OF THE INVENTION

An object of the present invention is to provide an ion beam apparatus that meets the needs of higher throughput and a finer observation beam especially on the high current side.

The present inventors have repeated analyses and experiments with respect to the beam diameter d and the ion beam current $I_p$ of the FIB, for the purpose of the structure analysis and failure analysis of the MEMS and semiconductor devices. As a result, the present inventors have found that the following conditions must be satisfied by the FIB. That is, the beam current $I_p$ must be at least 20 nA for the milling mode on the high current side. The beam diameter d in the specimen position must be $0.5 \times (I_p/20 \text{ nA})^{3/2}$ [µm] or less. However, the maximum value of d must not exceed 3 µm. For example, the condition expression $d \leq 0.5 \times (I_p/20 \text{ nA})^{3/2}$ [µm] yields $d \leq 0.5$ µm when $I_p = 20$ nA, and $I_p \geq 31.7$ nA when $d=1$ µm. The condition that the maximum value of d does not exceed 3 µm has been introduced from the fineness of the subject MEMS and semiconductor devices. As for the maximum current density $J_{max}$ of the milling beam, approximately 50 nA/cm² is needed. On the other hand, as for the observation mode, a FIB having $I_p \geq$ several pA and $d \leq 15$ nm is needed in the same way as the conventional apparatus example. As for the minimum value $d_{min}$ of d, however, the present inventors have found that a FIB having $d_{min} \leq 15$ nm and a beam current $I_p$ of at least 0.001 nA is required.

To achieve the above-described numerical values, that is, to realize the failure analysis of semiconductors which is the object of the present invention, a focused ion beam apparatus including a condenser lens and an objective lens to accelerate an ion beam emitted from an ion source and focus the ion beam onto a specimen, the condenser lens including at least a first electrode supplied with an extraction voltage and a second electrode supplied with an earth potential is formed according to the present invention so as to cause a distance from the emitter apex of the ion source to the second electrode included in the condenser lens to be in the range of 5 to 14 mm.

According to the above-described configuration, a FIB having a beam diameter d in the specimen position which is $0.5 \times (I_p/20 \text{ nA})^{3/2}$ [µm] or less when the beam current $I_p$ is at least 20 nA can be formed for the milling mode on the high current side. In other words, in the FIB, $d \leq 0.5$ µm when $I_p=20$ nA, whereas $I_p \geq 31.7$ nA when $d=1$ μm. Furthermore, as for the maximum current density $J_{max}$ of the milling beam, 50 A/cm² can be achieved. For example, when conducting box milling with a length 20 μm, a width 20 μm and a depth 20 μm on the surface of a Si specimen by using a FIB with $d=1$ μm and $I_p=32$ nA, the box milling time can be shortened to approximately 8.5 minutes, which is approximately half of the milling time in the conventional technique. On the other hand, in the observation mode, a FIB with $d_{min} \leq 6$ nm, where $d_{min}$ is the minimum value of d, and the beam current $I_p$ being at least 0.001 nA can be formed. As a result, it becomes possible to conduct the structure analysis and failure analysis of the MEMS and semiconductor devices with high throughput and high precision.

It is described in JP-A-2002-251976 that the distance from the liquid metal ion source to the condenser lens is set to 10 mm or less. However, its purpose is to prevent extracted ions spread with the distance from the ion source from striking against electrodes of the condenser lens (outside portion of the center hole). If extracted ions strike against the condenser lens, the place is shaved by sputtering, resulting in a shortened apparatus lifetime. Since this known example is different in purpose from the present invention, potential information of the condenser lens electrodes is not mentioned at all.

According to the present invention, the structure analysis and failure analysis of the MEMS and semiconductor devices can be implemented with high throughput.

Other objects, features and advantages of the invention will become apparent from the following description of the embodiments of the invention taken in conjunction with the accompanying drawings.

DESCRIPTION OF THE INVENTION

Hereafter, an embodiment of the present invention will be described with reference to the drawings.

Figure 1:
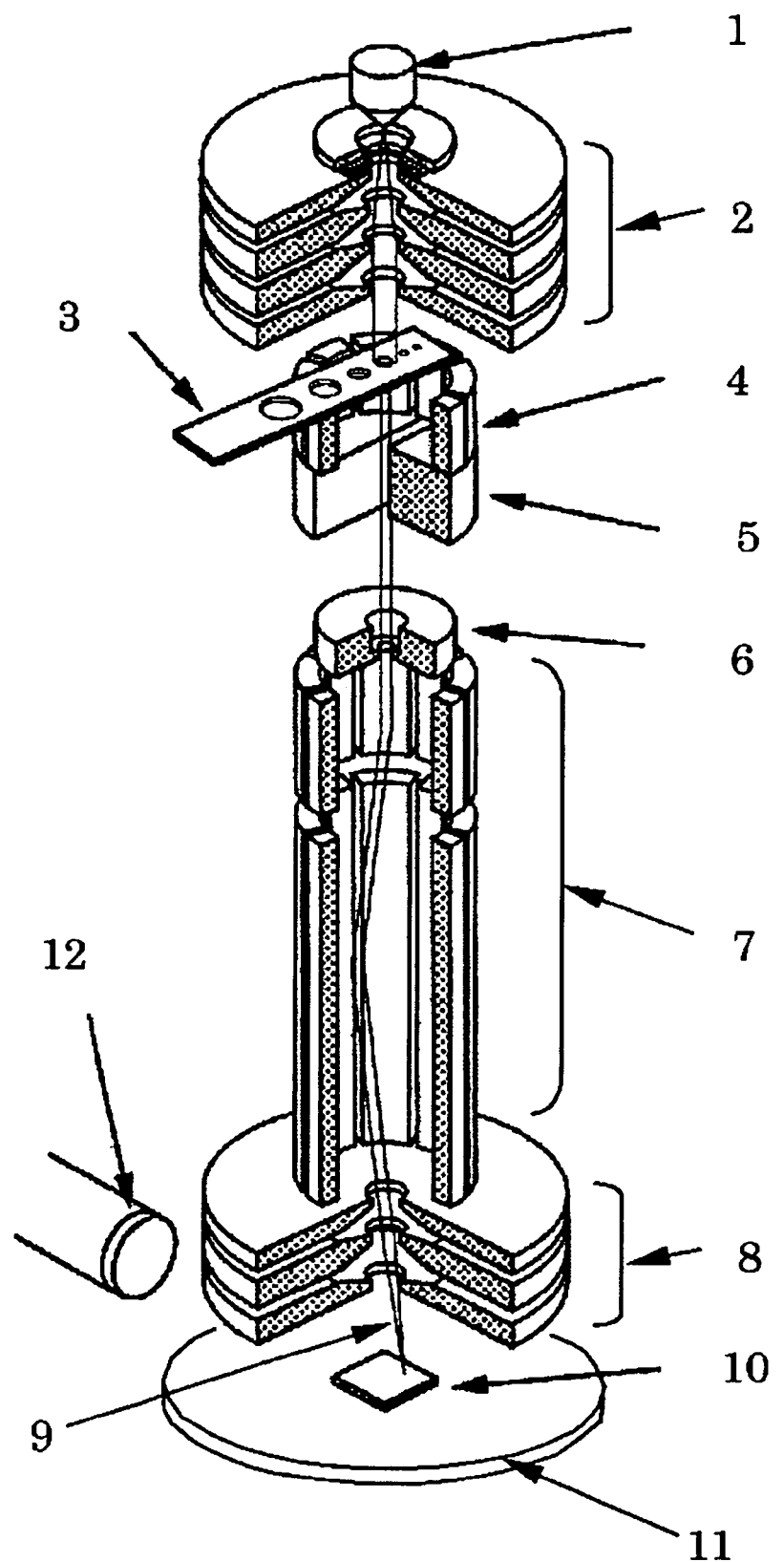
FIG. 1 is a diagram showing a configuration of an ion optical system in a focused ion beam apparatus.

FIG. 1 is a schematic configuration diagram of an ion optical system included in an FIB apparatus. An ion source 1 is a high brightness LMIS (Liquid Metal Ion Source) using gallium (Ga). Ions emitted from the ion source 1 are focused onto a specimen 10 by a condenser lens 2 and an objective lens 8. A beam diameter or a beam current of a FIB 9 is defined by a beam limiting aperture 3 disposed immediately after the condenser lens 2, and beam scanning on the specimen 10 is conducted by an electrostatic deflector 7. The specimen 10 is placed on a specimen stage 11, and it can be subject to XYZ movement, rotation and tilt. An aligner/stigmator 4, a blanker 5, and a blanking plate 6 are disposed on a downstream side of the beam limiting aperture 3. Secondary particles emitted from the specimen 10 by FIB irradiation are detected by a charged particle detector 12.

Figure 2:
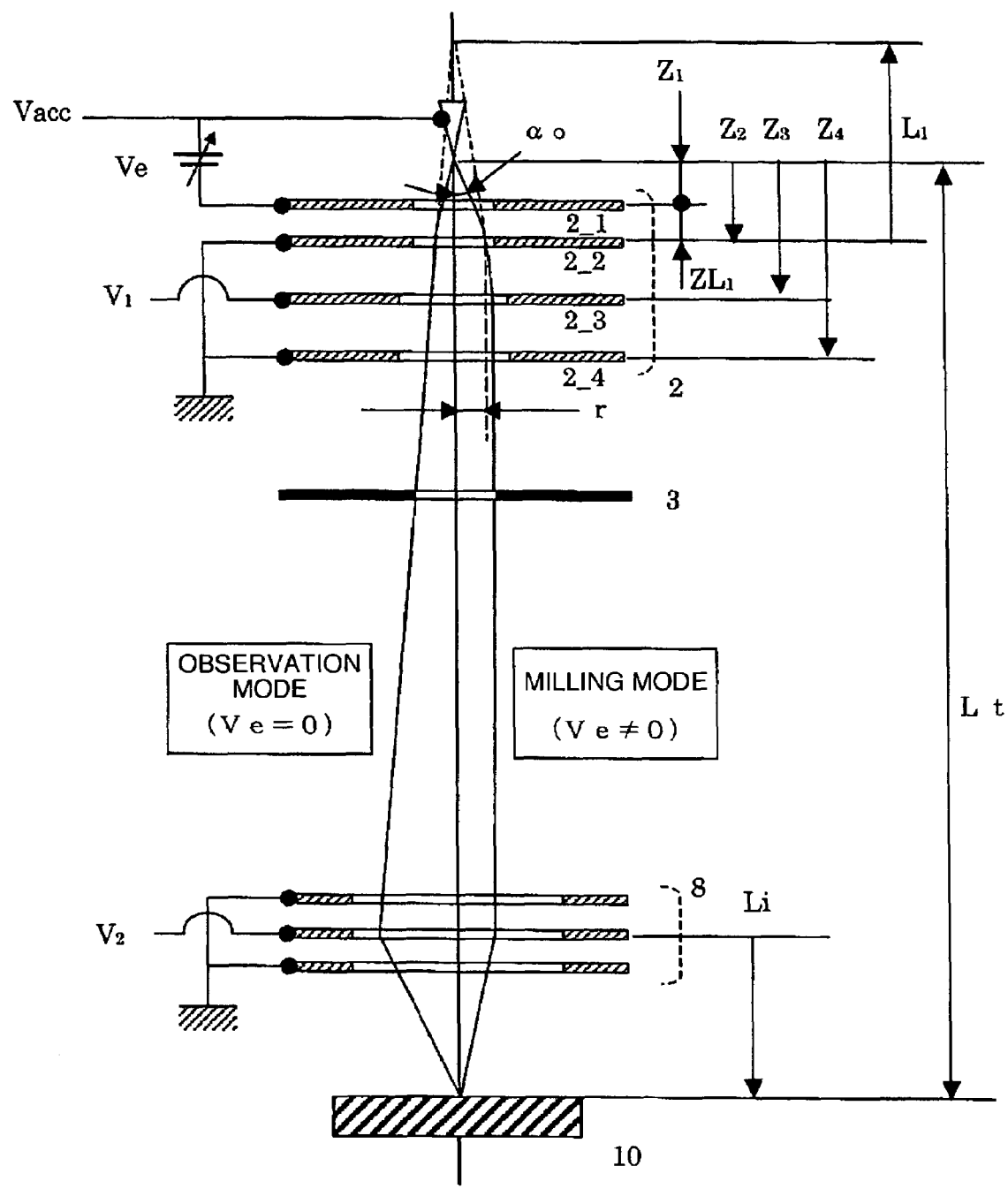
FIG. 2 is a diagram showing an ion optical length in a two-stage focused lens configuration.

As schematically shown in FIG. 2, the condenser lens 2 includes four electrodes. The electrodes are referred to as first, second, third and fourth electrodes in order from the top, and those electrodes are denoted by 2_1, 2_2, 2_3 and 2_4, respectively. The first to fourth electrodes are supplied with an ion extraction voltage Ve (with an emitter potential of the ion source taken as reference), an earth potential, a lens potential V1, and the earth potential, respectively. In some cases, the second electrode is bisected along the optical axis. In this case, both electrodes are at the same potential, and a lens action is not caused between them.

Mode changes caused by condenser lens switching will now be described. Two different focusing modes are available by switching the potential $V_1$ at the third electrode 2_3 in the condenser lens; that is (a) high current density beam mode for FIB milling and (b) fine beam mode for image observation using a scanning ion microscope (SIM). In the milling mode, the lens potential $V_1$ is further adjusted every beam diameter (every aperture diameter of the beam limiting aperture 3). In FIG. 2, ion paths are shown near the optical axis, one on the left and one on the right. The left path corresponds to a representative observation beam, and the right path corresponds to a representative milling beam.

A conventional technique will now be described to clarify the embodiment of the present invention. The conventional apparatus has a lens configuration similar to that shown in FIG. 2, and only the optical length between lens electrodes is different. The total ion optical length Lt from the ion emitter apex in the ion source 1 to the specimen 10 is in the range of 300 to 450 mm. A distance $Z_3$ from the ion emitter apex to the condenser lens center is 45 mm or less. A distance Li from the objective lens center to the specimen is 40 mm or less. With respect to both modes for FIB milling and SIM image observation in the conventional apparatus, representative curves of the beam diameter d versus the beam current $I_p$ are indicated on a graph (full logarithmic scales) in FIG. 3 as Conv. (Mill.) and Conv. (Obs.). Marks ● and ○ on the curves correspond to various aperture diameters of beam limiting apertures. On one curve, as a mark has smaller $I_p$, its aperture diameter becomes smaller. The conventional focused ion beam apparatus is summarized as follows.

(1) The maximum current density $J_{max}$ of the milling beam is approximately 15 A/cm².

(2) The beam diameter d of a finishing milling beam having $I_p$=several tens pA is $d \leq 40$ nm.

(3) In the fine beam (observation) mode, a beam with $d \leq 15$ nm can be formed at $I_p \geq$ several pA.

Figure 3:
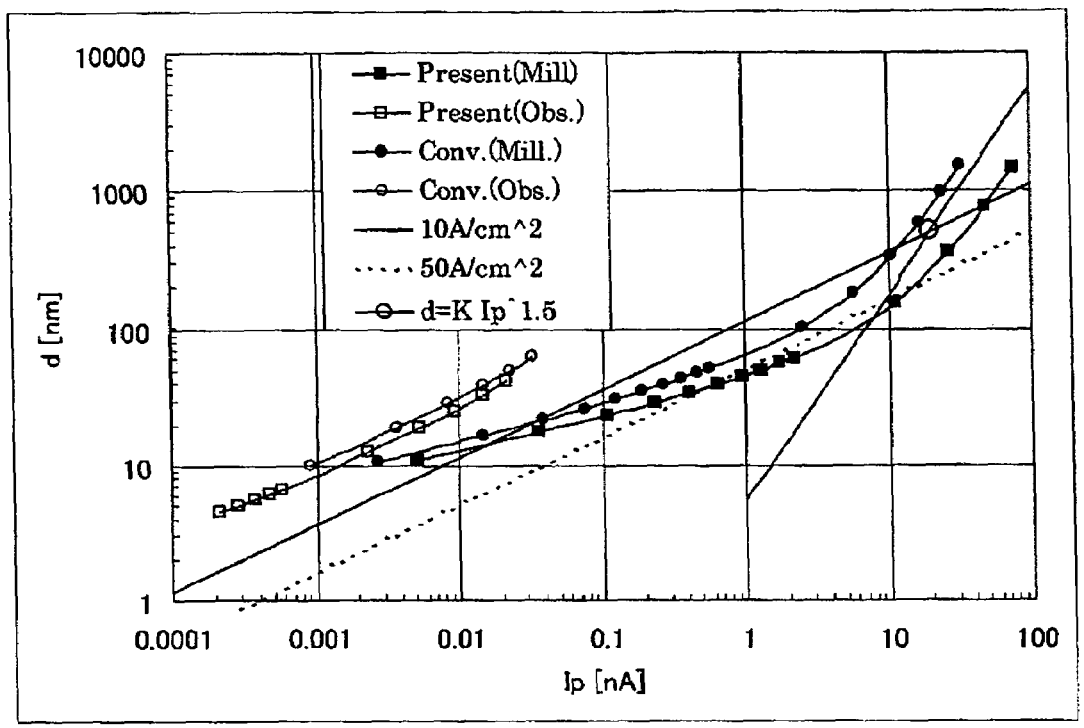
FIG. 3 is a representative beam diameter versus beam current (d-$I_p$) characteristic diagram in a conventional apparatus and the present invention apparatus.

(4) As for the curve of milling mode Conv. (Mill.), a beam diameter ds caused by spherical aberration becomes predominant in the beam diameter d on a large current side of $I_p \geq 20$ nA. The beam diameter d can be approximated by using a proportional equation of the one and one-half power with respect to $I_p$, i.e., $d=K \cdot I_p^{1.5}$ where K is a proportionality constant. In the full logarithmic scale graph, this approximation equation becomes a straight line having a gradient equal to 1.5 (as described later). When μm and nA are respectively taken as units of d and $I_p$, the value of the proportionality constant K in the proportional equation is always greater than 0.5. (In other words, for example, a beam at $I_p=20$ nA already has d>0.5 μm.) In FIG. 3, a point $(I_p, d)=(20$ nA, 0.5 μm) is indicated by an open circle (○), and a straight line having a gradient of 1.5 and passing through this point is also shown.

The FIB apparatus according to the present invention provides beams of the following two kinds. In the milling mode, the FIB apparatus provides a beam that makes the K value equal to 0.5 or less on the large current side with $I_p \geqq 20$ nA. In the observation mode, the FIB apparatus provides a beam with $d_{min} \leqq 6$ nm and $I_p \geqq 0.001$ nA, where $d_{min}$ is the minimum value of d.

An outline of the ion optical system in the FIB apparatus which is the embodiment of the present invention will now be described with reference to FIG. 2. The optical system has a two electrostatic lens configuration including the condenser lens 2 and the objective lens 8. Distances from the ion emitter apex respectively to the first, second, third and fourth electrodes are denoted by $Z_1$, $Z_2$, $Z_3$ and $Z_4$, respectively. The four-electrode condenser lens is a combined lens including an ion extraction & acceleration lens formed of the first and second electrodes and a unipotential lens formed of the second, third and fourth electrodes. The ion source is a Ga liquid metal ion source (LMIS). The acceleration voltage Vacc of the ion source is set to 30 to 40 kV to conduct ion sputter milling efficiently. However, the design allowance is set to approximately 3%, and the maximum range of the acceleration voltage Vacc is set to a range of 30 to 40 kV. The ion extraction voltage Ve is set to 5.5 to 8.5 kV. The total optical length Lt from the ion emitter apex in the ion source 1 to the specimen 10 is in a range of 300 to 450 mm in the same way as the conventional apparatus (U.S. Pat. No. 5,852,297). The distance from the objective lens center to the specimen is also 40 mm or less in the same way as the conventional apparatus. Limitations in these ranges are also needed to achieve the object of the present invention.

The optical length and potentials are fixed. The beam emission semi-angle on the incidence side of the condenser lens used to form the FIB is denoted by $\alpha_0$. In general, the beam diameter d is represented by the following equations using a Gaussian image diameter dg, a beam diameter dc due to chromatic aberration, and a beam diameter ds due to spherical aberration.

$$d^2 = dg^2 + dc^2 + ds^2 \quad (1)$$

$$dg = M_t Ds \quad (2)$$

$$dc = Hc \cdot \alpha_0 \cdot \Delta V \quad (3)$$

$$ds = (1/2) Hs \cdot \alpha_0^3 \quad (4)$$

$$Hc = M_t \cdot Cc / Ve \quad (5)$$

$$Hs = M_t \cdot Cs \quad (6)$$

Here, $\Delta V$ is a voltage converted from an energy width $\Delta E$ of extracted ions. Ve is an ion extraction voltage (with the emitter potential taken as the origin). Ds is a virtual source size ($\approx 50$ nm) of the ion source. $M_t$ is a lens magnification of the ion optical system, and $M_t$ is equal to the product of magnifications $M_1$ and $M_2$ respectively of the condenser lens and the objective lens. Cc and Cs are chromatic and spherical aberration coefficients (defined on the ion source side), respectively. On the other hand, the beam current $I_p$ is represented by the following equation using an angular current (or emission) density $dI/d\Omega$ ($\approx 20$ μA/sr).

$$I_p = (dI/d\Omega)(\pi \alpha_0^2) \quad (7)$$

In a region where $I_p$ is large and the beam diameter ds due to spherical aberration is dominant so that the relation d≈ds holds, the following approximation equation using a proportionality constant K can be obtained from the equations (4) and (7).

$$D = K I_p^{3/2} \quad (8)$$

Figure 4:
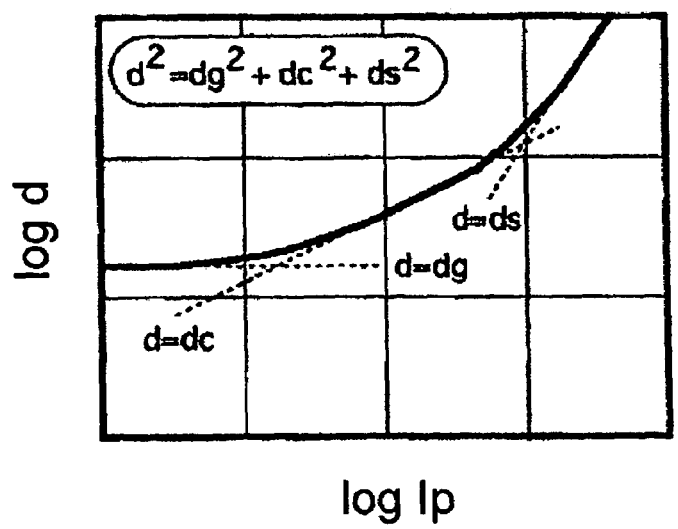
FIG. 4 is a beam diameter versus beam current (d-$I_p$) characteristic diagram (full logarithmic scale plots) obtained when a lens condition is fixed and only an aperture diameter of a beam limiting aperture is varied.

A d-$I_p$ curve obtained by making the lens condition and the optical distances such as distances between the condenser and objective lenses constant and making only the aperture diameter of the beam limiting aperture variable is plotted on a full logarithmic scale sheet as shown in FIG. 4. As a basic feature of the d-$I_p$ curve, it is appreciated that respectively in large, medium and small current regions d can be approximated by beam diameters (ds, dc and dg) in which the spherical aberration, chromatic aberration, and Gaussian image are respectively dominant. In the d-$I_p$ curve in the milling mode shown in FIG. 3, the optical distance is constant, but the lens conditions are adjusted so as to maximize the beam current density every aperture diameter of the beam limiting aperture in the beam current region of 0.01-100 nA. Its gradient on the full logarithmic scale sheet deviates from ½ and becomes close to ¼ in the current region of $I_p < 1$ nA.

First, a beam that always makes the value of K equal to 0.5 or less on the large current side of $I_p \geqq 20$ nA in the milling mode is supposed. This corresponds to making ds small in the large current region. Making ds small is equivalent to making Hs small, i.e., making Cs small together with Mt. Here, Cs can be obtained by the following integration conducted along the optical axis from the ion source emitter on the optical axis z to the specimen.

$$Cs = (1/64) \int (V/Ve)^{1/2} [4S'^2 + 3S'^4 - 5S^2 S'' - SS''] r^4 dz \quad (9)$$

Here, S is equal to V'/V. V is a potential on the optical axis. V' is a first derivative of V with respect to z ($= dV/dz$), and r is a separation distance of the beam trajectory from the optical axis. The integrand includes a term of the fourth power of r. The present inventors have found that passing a beam having small r through lenses is important in making Cs small.

The condenser lens and the objective lens contribute to the value of Cs. Contribution of the condenser lens to making the current large is great. Therefore, the present inventors have found that it is necessary for the sake of making Cs small that the fourth power $r^4$ of the separation distance r of the beam (where $\alpha_0 = 1$ rad) from the optical axis is small in the z position of the outlet electrode 2_2 in the ion extraction & acceleration region (between the electrodes 2_1 and 2_2) of the condenser lens 2. By the way, the electrode 2_2 serves also as an inlet electrode of the unipotential region (between the electrodes 2_2 and 2_4) disposed thereafter. Specifically, as a result of various calculations and experiments, the present inventors have found that making especially Cs small among the subjects of making both $M_t$ and Cs small is important in forming a beam having a beam diameter d of $0.5 \times (I_p/20 \text{ nA})^{3/2}$ [μm] or less. For that purpose, the present inventors have found that restriction of $r^4 \leqq 1600$ mm$^4$ ($r \leqq 6.3$ mm) is necessary.

The condition in the observation mode, i.e., $d_{min} \leqq 6$ nm and $I_p \geqq 0.001$ nA will now be described. In the observation mode, the lens voltage $V_1$ is the earth potential, and dg and dc mainly determine d in the equation (1). In particular, dg indicates a minimum limit of d, and the lens magnification $M_t$ ($= M_1 M_2$) becomes important. Therein, the lens magnification $M_1$ of the condenser lens 2 is important. As a result of various calculations and experiments, the present inventors have found that the restriction $M_1 \leq 8$ is necessary. The reason is as follows. If an image point position of the condenser lens is disposed on the emitter side (i.e., in the case of a virtual image point), increasing $M_1$ decreases $M_2$. Since the increase rate of $M_1$ excels, however, $M_t$ becomes large. As a result, dg also becomes large.

As a result of various calculations and experiments, the present inventors have found that it is necessary in order to satisfy both $r^4 \leq 1600$ mm$^4$ in the milling mode and $M_1 \leq 8$ in the observation mode that the distance $Z_2$ from the ion emitter apex in the ion source 1 to the earth electrode 2_2 having the earth potential included in the condenser lens is 14 mm or less. If $Z_2$ is too short, electric discharge occurs between the emitter apex and the electrode 2_1 or between the electrodes 2_1 and 2_2. Practically, at least 5 mm is necessary. As a result, the range of $Z_2$ has become 5 to 14 mm.

As for the conventional apparatus described in U.S. Pat. No. 5,852,297, it is presented as the condition that the distance Z3 from the ion source 1 to the center of the condenser lens (the position of the third electrode 2_3 which is dominant in the lens action is used as the representative electrode) should be 45 mm or less. However, this condition alone is not sufficient. According to the present invention, the restriction of the range of 5 to 14 mm is necessary with respect to the distance $Z_2$ from the ion source 1 to the earth electrode 2_2 in the condenser lens which is disposed nearest to the ion source.

Hereafter, this range restriction will be described with reference to calculated characteristic curves shown in FIG. 5. Each graph shows curves of dependence of $M_1$ and $r^4$ upon $Z_2$. The extraction voltage is Ve=6, 7 and 8 kV. Calculation conditions concerning Vacc and a distance $ZL_1$ between electrodes 2_1 and 2_2 in the graphs shown in FIG. 5 is shown in TABLE 1.

TABLE 1

Figure 5:
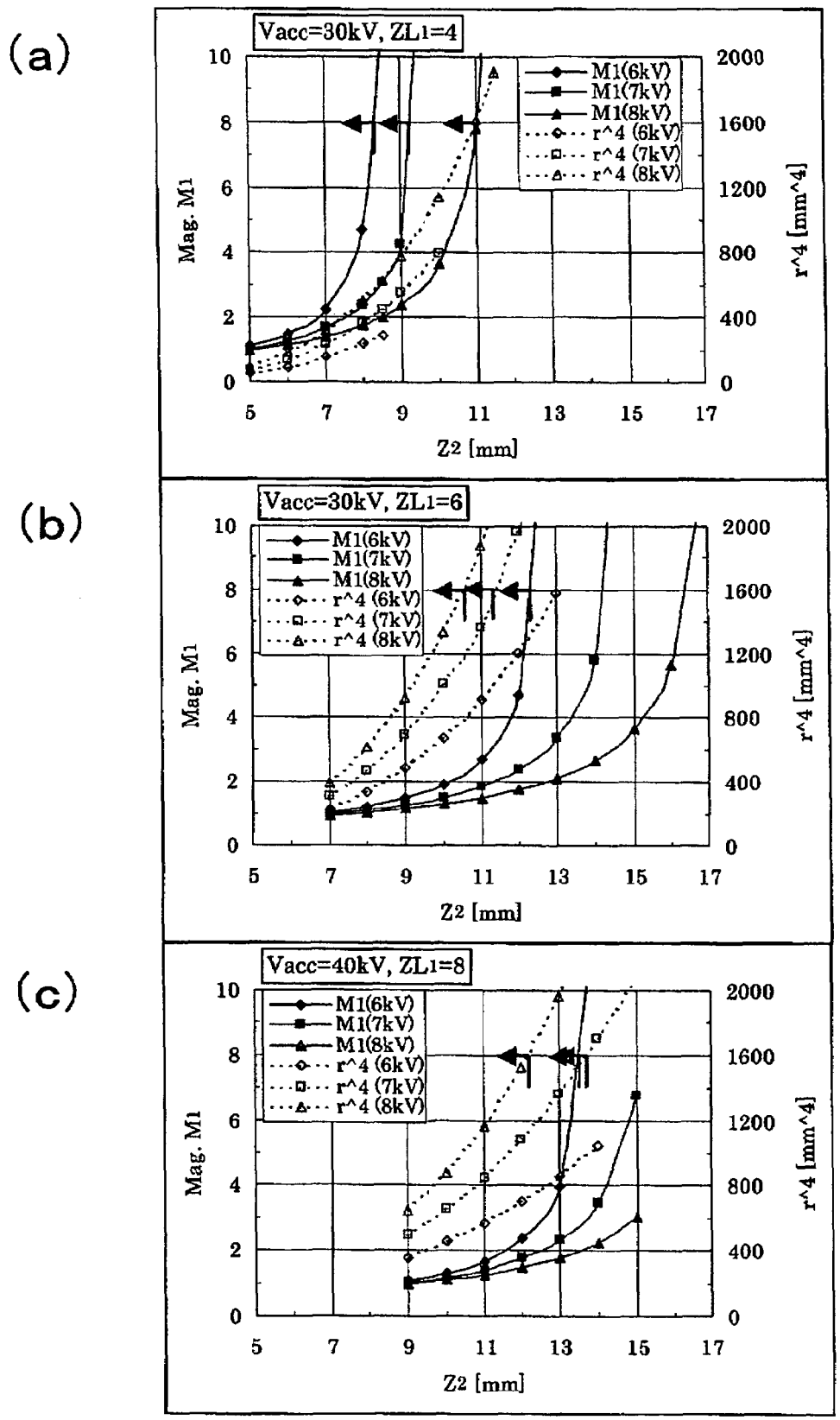
FIG. 5 is curves showing dependence of a condenser lens magnification M1, and a fourth power value $r^4$ of an axis leaving quantity r in an electrode 2_2 position on a beam trajectory of a beam emission semi-angle upon a distance $Z_2$ between an ion source emitter and the electrode 2_2.

|  | $V_{acc}$ [kV] | ZL1 [mm] |
|---|---|---|
| FIG. 5 (a) | 30 | 4 |
| FIG. 5 (b) | 30 | 6 |
| FIG. 5 (c) | 40 | 8 |

In FIG. 5(*a*), an upper limit value of $Z_2$ [mm] satisfying both range restrictions $M_1 \leq 8$ mm and $r^4 \leq 1600$ mm$^4$ is 8.3, 9.3 and 11 mm respectively when Ve=6, 7 and 8 kV. In FIG. 5(*b*), the upper limit value is 8.5, 11.4 and 12.5 in the same way. In FIG. 5(*c*), the upper limit value is 12.2, 13.5 and 13.7 in the same way. The maximum value of $Z_2$ obtained by taking them into consideration is 13.7. The maximum value of $Z_2$ is set to 14 by rounding 13.7 to the nearest whole number.

The d-$I_p$ characteristic curves (Present (Mill.) and Present (Obs.)) shown in FIG. 3 are characteristic curves in the optical system (Ve=8 kV) shown in FIG. 5(*b*). The lens condition is adjusted so as to maximize the beam current density every aperture diameter of the beam limiting aperture. As the K value on the characteristic curves Present (Mill.) in the milling mode, 0.2 has been obtained. $I_p$ corresponding to d≈1 μm becomes approximately 70 nA. In the d-$I_p$ graph shown in FIG. 3, straight lines of current densities J=10 A/cm$^2$ and 50 A/cm$^2$ (with a gradient of ½) are also drawn. The d-$I_p$ characteristic curve in the milling mode in the present invention apparatus partially exceeds the straight line of J=50 A/cm$^2$, and the relation $J_{max} \geq 50$ A/cm$^2$ is achieved.

According to the present embodiment, $I_p$ corresponding to, for example, d≈1 μm in the milling mode can be increased to at least three times as compared with the conventional apparatus even under various optical conditions. In milling using the beam with d≈1 μm (with the milling precision of approximately 1 μm), the milling time can be shortened to ⅓ or less. The throughput in the structure analysis and failure analysis of the MEMS and high function fine devices can be improved to at least three times. On the other hand, in the SIM image observation in the observation mode, its highest image resolution is 6 nm or less. The beam characteristics in the observation mode are superior or equivalent to those in the conventional apparatus.

Figure 6:
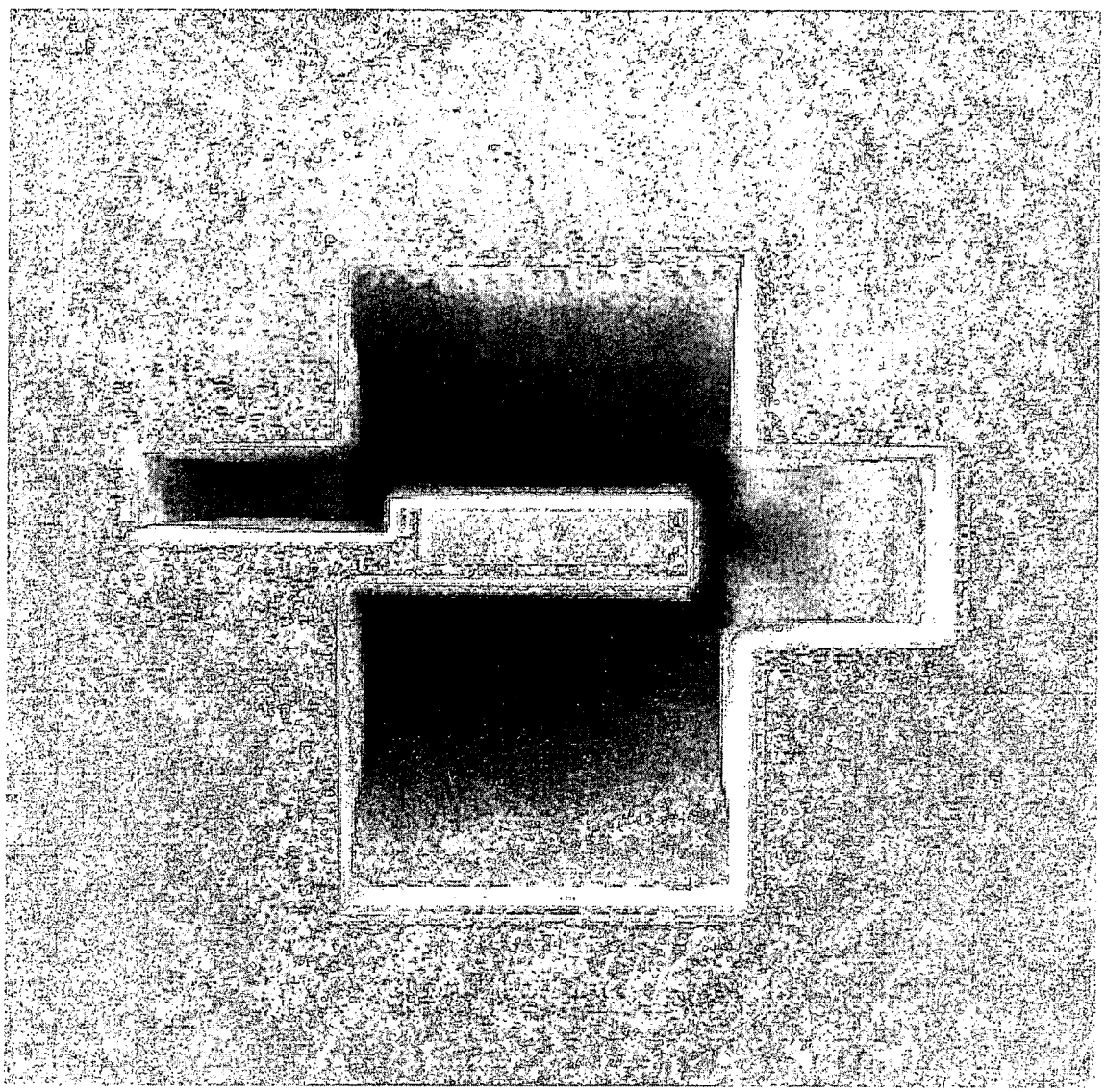
FIG. 6 is a diagram (SIM image) showing an example of micro-sampling milling conducted by using a milling beam of the present embodiment.

An embodiment in which the present invention apparatus is applied to a specimen separation method (hereafter referred to as micro-sampling method) described in Japanese Patent No. 2774884 will now be described. According to the micro-sampling method, it is possible, in the structure and failure analysis of high function micro-Si devices or the like, to mill a micro-sample for transmission electron microscope (TEM) with a FIB and take out it by using a micro-manipulator installed in the specimen chamber without dividing the Si device substrate. FIG. 6 shows a SIM image (a field of view FOV=70 μm) of the substrate subjected to FIB milling using the micro-sampling method in the present invention apparatus. A small piece surrounded by four large and small milling boxes corresponds to the micro-sample. As for dimensions of the milled portions, the lateral width of the lower box is 27 μm and the maximum milling depth is approximately 15 μm. Milling time of all boxes using a large current beam of the present invention apparatus is approximately eight minutes. The milling time has been one third times shorter as compared with the conventional apparatus.

The present embodiment is an example in which the present invention is applied to micro-sampling milling. Even if the present invention is applied to cross-sectioning conducted by combining ordinary box milling, an equivalent milling time shortening effect has been obtained. This milling time shortening is effective especially in the section structure analysis and failure analysis of the MEMS parts and semiconductor devices. The number of specimens that can be subject to section fabrication per unit time can be increased to twice to four times. As a result, the precision of estimation factors can be improved in the technique of estimating failure factors by conducting statistical processing on a large number of analyses.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A focused ion beam apparatus including an ion source, a condenser lens and an objective lens to accelerate an ion beam emitted from the ion source and focus the ion beam onto a specimen, a deflector to scan the specimen with the focused ion beam, and a beam limiting aperture to limit a beam current or a beam diameter of the focused ion beam, wherein:

the condenser lens comprises at least a first electrode supplied with an extraction voltage, and a second electrode supplied with an earth potential, a distance from an emitter apex of the ion source to the second electrode included in the condenser lens is in the range of 5 to 14 mm, and a distance from the emitter apex of the ion source to the condenser lens center is 45 mm or less.

2. The focused ion beam apparatus according to claim 1, wherein the ion source is a liquid metal ion source.

3. The focused ion beam apparatus according to claim 1, wherein a voltage applied to the emitter in the ion source is in a range of 29 to 41 kV.

4. The focused ion beam apparatus according to claim 1, wherein an optical length from the emitter apex in the ion source to the specimen is in a range of 300 to 450 mm.

5. A focused ion beam apparatus including an ion source, a condenser lens and an objective lens to accelerate an ion beam emitted from the ion source and focus the ion beam onto a specimen, a deflector to scan the specimen with the focused ion beam, and a beam limiting aperture to limit a beam current or a beam diameter of the focused ion beam, wherein:

a focused ion beam is formed, in which a beam current $I_p$ is at least 20 nA, and a beam diameter d in a specimen position does not exceed 3 μm and the beam diameter d in the specimen position is $0.5\ (I_p/20\ nA)^{3/2}$ μm or less, and a distance from an emitter apex of the ion source to the condenser lens center is 45 mm or less.

6. The focused ion beam apparatus according to claim 5, wherein an optical length from the emitter apex in the ion source to the specimen is in a range of 300 to 450 mm.

7. A focused ion beam apparatus including an ion source, a condenser lens and an objective lens to accelerate an ion beam emitted from the ion source and focus the ion beam onto a specimen, a deflector to scan the specimen with the focused ion beam, and a beam limiting aperture to limit a beam current or a beam diameter of the focused ion beam, wherein:

the condenser lens comprises at least a first electrode supplied with an extraction voltage, and a second electrode supplied with an earth potential, a distance from an ion emitter apex of the ion source to the second electrode included in the condenser lens is in the range of 5 to 14 mm, and a distance from the ion emitter apex to a third electrode for dominantly performing lens action of the condenser lens is 45 mm or less.

* * * * *